United States Patent [19]

Tihanyi et al.

[11] Patent Number: 4,578,595
[45] Date of Patent: Mar. 25, 1986

[54] CIRCUIT ARRANGEMENT FOR DRIVE OF A THYRISTOR WITH LIGHT

[75] Inventors: Jenö Tihanyi; Christine Fellinger; Ludwig Leipold, all of Munich, Fed. Rep. of Germany

[73] Assignee: Siemens Aktiengesellschaft, Berlin and Munich, Fed. Rep. of Germany

[21] Appl. No.: 664,485

[22] Filed: Oct. 24, 1984

[30] Foreign Application Priority Data

Dec. 8, 1983 [DE] Fed. Rep. of Germany ....... 3344476

[51] Int. Cl.$^4$ .................. H03K 17/60; H03K 3/45; H03K 17/687
[52] U.S. Cl. .................. 307/252 R; 307/252 N; 307/252 UA; 307/311; 307/581
[58] Field of Search ....... 307/252 R, 252 H, 252 UA, 307/311, 570, 581

[56] References Cited

U.S. PATENT DOCUMENTS

| | | | |
|---|---|---|---|
| 4,021,683 | 5/1977 | Splatt | 307/252 UA |
| 4,217,618 | 8/1980 | Kellenbenz et al. | 307/311 |
| 4,295,058 | 10/1981 | Lade et al. | 307/252 UA |
| 4,324,989 | 4/1982 | Stut | 307/252 UA |
| 4,413,192 | 11/1983 | Crockett | 307/311 |
| 4,535,251 | 8/1985 | Herman et al. | 307/311 |

FOREIGN PATENT DOCUMENTS 2738186 3/1978 Fed. Rep. of Germany.

OTHER PUBLICATIONS

Siemens Components, XVII (1982) No. 2, "Solid State Relays (SSR) Performance and Practical Use", by Walter Brunnler, pp. 83–87.

Primary Examiner—Stanley D. Miller
Assistant Examiner—B. P. Davis
Attorney, Agent, or Firm—Hill, Van Santen, Steadman & Simpson

[57] ABSTRACT

A circuit arrangement for drive of a thyristor with light comprises a zero pause control which permits an ignition of a thyristor only in a proximity of a zero point of the thyristor voltage. The control contains an IGFET which transports away a base current of the phototransistor effecting ignition when the thyristor voltage exceeds a specific value. The gate terminal of the IGFET connects to an alternating voltage via a photodiode. The zero point control can only be activated when the photodiode is illuminated.

8 Claims, 2 Drawing Figures

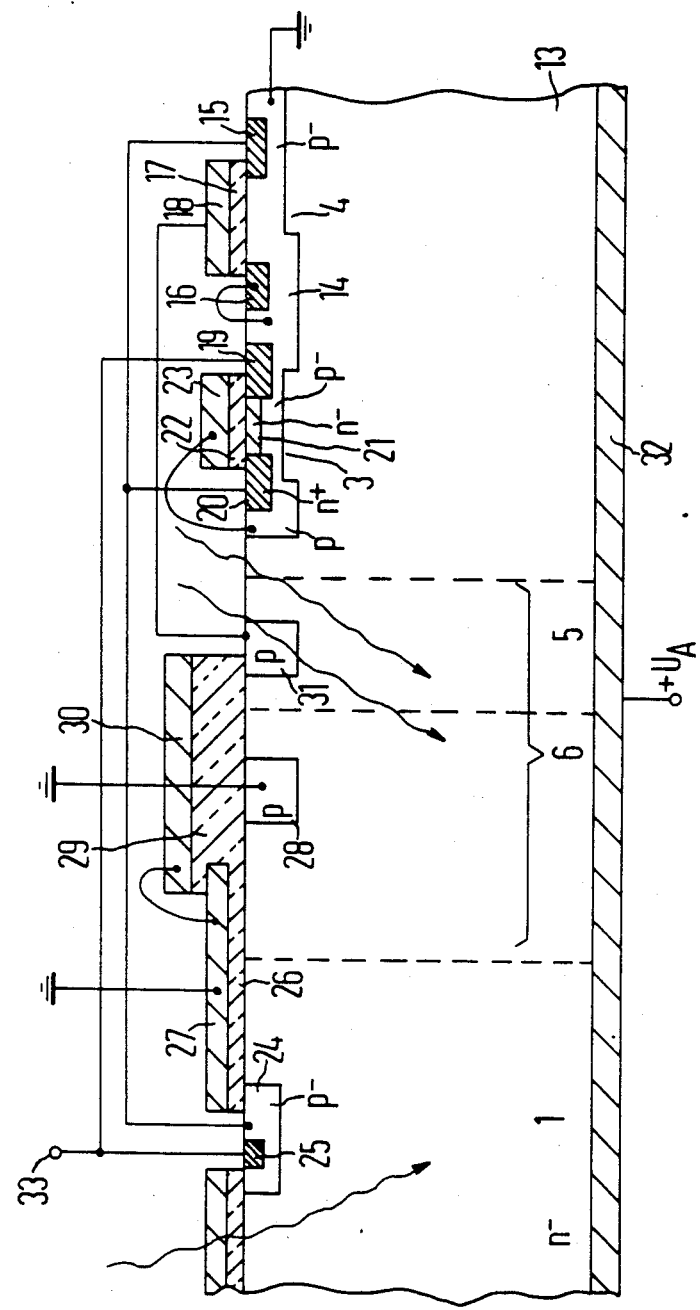

CIRCUIT ARRANGEMENT FOR DRIVE OF A THYRISTOR WITH LIGHT

BACKGROUND OF THE INVENTION

The invention relates to a circuit arrangement for the drive of at least one thyristor connected to an alternating voltage. A phototransistor and an auxiliary transistor which enables an ignition of the thyristor only in a proximity of a zero point of the alternating voltage are provided.

Such a circuit arrangement has been described, for example, in "Siemens Components", 20 (1982), No. 3, FIG. 2 and pages 83–84, incorporated herein by reference. Given this circuit arrangement, the base terminal of the auxiliary transistor is connected to the alternating voltage via a resistor. The collector-emitter path of the auxiliary transistor lies in parallel with the gate-cathode path of the thyristor to be ignited. When the alternating voltage then rises from zero to a specific value, then the auxiliary transistor becomes conductive and short-circuits the gate-cathode path of the thyristor. The thyristor can then no longer be triggered. Ignition is only possible as long as the alternating voltage has not exceeded a specific value and the phototransistor lying between the base terminal and emitter terminal of the auxiliary transistor is activated.

SUMMARY OF THE INVENTION

Given this circuit arrangement, a quiescent current which corresponds to the base current of the auxiliary transistor flows in the non-triggered condition of the thyristor.

An object of the invention is to improve a circuit arrangement of the described type such that the quiescent current for such an arrangement is greatly reduced.

The invention is characterized by the following features:

(a) The collector-emitter path of the phototransistor lies between a first of two alternating voltage terminals and the gate terminal of the thyristor;

(b) The source-drain path of an IGFET of the enhancement type lies between the base terminal of the phototransistor and the second alternating current terminal;

(c) A photodiode lies between the gate terminal of the IGFET and the first alternating voltage terminal;

(d) The photodiode is poled such that it is biased in a reverse direction when voltage in the conducting direction is present at the thyristor; and (e) The IGFET has a higher threshold voltage and a lower input capacitance than the phototransistor.

BRIEF DESCRIPTION OF THE DRAWINGS

FIG. 2 illustrates a cross-section through an integrated arrangement of component parts of the circuit which lie to a left of a broken line in FIG. 1.

DESCRIPTION OF THE PREFERRED EMBODIMENTS

Figure 1:
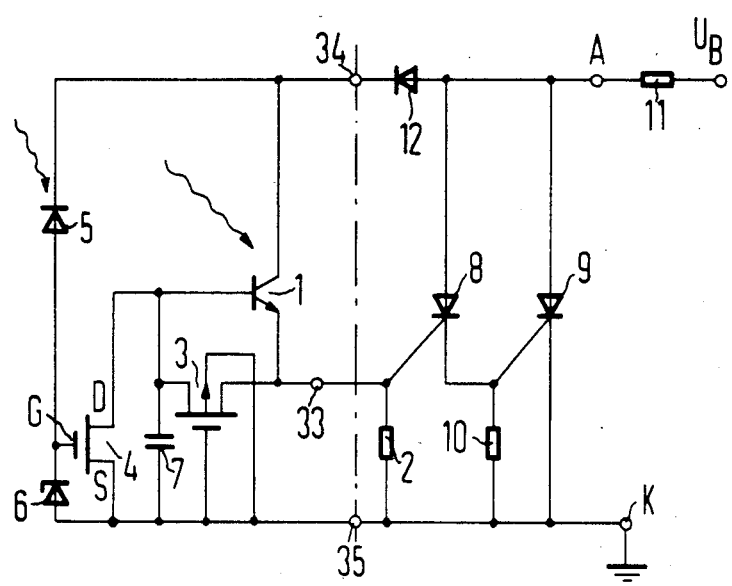
FIG. 1 illustrates a circuit arrangement of the invention.

The circuit arrangement of FIG. 1 contains a phototransistor 1 whose collector terminal is connected to a first alternating voltage terminal 34. This terminal can be directly connected to an anode terminal A. A diode 12 can be connected therebetween for protecting the phototransistor 1 against reverse current load. The source-drain path of an IGFET 4 of the enhancement type which, for example, can be a MOSFET, lies between the base terminal of the phototransistor 1 and a second alternating voltage terminal 35. The second alternating voltage terminal can be directly connected to a cathode terminal K which, for example, lies at ground. The gate terminal G of the IGFET 4 is connected to the terminal 34 via a photodiode 5. A Zener diode 6 which limits the gate-source voltage for the IGFET 4 preferably lies between the gate terminal G and the source terminal S of the IGFET 4. A capacitor 7 can lie between the base terminal of the phototransistor 1 and the terminal 35. A resistor 3 preferably lies between the base terminal of the phototransistor 1 and its emitter terminal, the resistor 3 being, for example an IGFET of a depletion type whose gate terminal is connected to a terminal 35. The photodiode is illuminated by the light source for the phototransistor or by a second light source which operates synchronously thereto.

The power part consists of at least one thyristor whose anode-cathode path lies between the terminals A and K. The thyristor, however, can also be a thyristor having an auxiliary thyristor which amplifies the ignition current, as shown in FIG. 1. The thyristor 9 is then the main thyristor. Its control current is formed by the load current of the auxiliary thyristor 8 which in turn lies between the terminal A and the gate terminal of the thyristor 9. The gate terminal of the auxiliary thyristor 8 is connected to the emitter of the phototransistor 1. The gate-cathode resistors 2 and 10 serve for improvement of the dv/dt behavior in a known fashion.

The circuit arrangement serves for control of the current in a load 11 that lies between the terminal A and a terminal having the operating voltage $U_B$. In order to explain a function of the circuit, three essential operating conditions shall be described:

1. The operating voltage $U_B$ is connected to the load, this operating voltage being an alternating voltage. When the phototransistor 1 does not receive any light as a control signal, then it remains inhibited and the auxiliary thyristor 8 receives no current. It can thus not trigger and the main thyristor 9 also remains inhibited. With respect to that voltage which is connected to the thyristor in a conducting direction, the photodiode 5 is poled in a reverse direction. It forms a very high resistance of a number of MOhms, so that a quiescent current only on the order of a few $\mu A$ or even less flows in an idle condition of the circuit.

2. Proceeding from a zero point, the alternating voltage rises toward positive values and the phototransistor receives a light signal simultaneously with the photodiode 5. The phototransistor is thus switched on and its emitter current flows to the thyristor 8. This presumes that the IGFET 4 is inhibited and the base current of the phototransistor does not flow off to the terminal 35. This is achieved since the threshold voltage of the IGFET 4 is selected higher than the threshold voltage of the phototransistor 1. The IGFET 4 is thus only switched on at a higher voltage than the phototransistor 1. Since, however, the phototransistor 1 was already conductive, the thyristor 8 and thus the thyristor 9 could already trigger and the load 11 receives current.

3. Proceeding from zero, the operating voltage has already risen to a positive value at which the thyristors are no longer allowed to trigger. When a light signal then impinges the phototransistor 1 and the photodiode 5, then the IGFET 4 is activated and carries the base current of the phototransistor off to the terminal K, i.e. to the grounded potential. The thyristors can thus not be triggered. The earlier engagement of the IGFET 4 is assured since its gate-source capacitance is lower than an input capacitance of the phototransistor 1. If the natural input capacitance of the phototransistor 1 is not high enough, then the capacitor 7 is connected between its base terminal and a terminal 35.

The Zener diode 6 between the gate terminal G and source terminal S of the IGFET 4 limits the gate-source voltage to a value of, for example, 10 V that is non-hazardous for the IGFET 4. Its threshold voltage can be set in a known fashion via the thickness of the gate oxide and/or the doping of the substrate under the gate electrode.

The IGFET 3 lying between the base terminal and emitter terminal of the phototransistor 1 represents a variable resistor which represents a low resistance in an off condition of the phototransistor but represents a high resistance in an on condition. This produces an increase in the reverse voltage strength in the unilluminated condition and a high current gain in the illuminated condition.

In the integrated arrangement of FIG. 2, identical parts are provided with the same reference characters as in FIG. 1. The base of the integrated circuit is, for example, a semiconductor body 13 that is weakly negatively doped. Integrated therein from left to right are the phototransistor 1, the photodiode 5 and the Zener diode 6, the IGFET 3, and the IGFET 4.

The phototransistor 1 comprises a base zone 24 which has a conductivity type opposite that of the semiconductor body 13. For example, it is weakly p-doped. An emitter zone 25 of first conductivity type is embedded in a base zone 24. It is, for example, highly n-doped. The photodiode has a zone 31 of conductivity type opposite that of the semiconductor body embedded into the semiconductor body. The zone 31 forms the anode zone of the photodiode and the semiconductor body 13 forms the cathode zone. A substrate 14 having more highly and weakly p-doped regions is embedded into the semiconductor body 13 for the IGFETs 3 and 4. Thicker parts of the substrate are, for example, more highly p-doped and the thinner parts of the substrate are more weakly p-doped. The differently p-doped regions of the substrate 14 can, however, be of the same thickness. The IGFET 4 comprises a drain zone 15 and a source zone 16. Source zone 16 is electrically connected to the substrate 14. An insulating layer 17 of, for example, silicon dioxide which overlaps the source zone and the drain zone lies on the substrate. A gate electrode 18 or, for example, doped polycrystalline silicon, is disposed thereabove and overlaps both zones. Given application of a control voltage, the gate zone of the IGFET 4 is formed in the substrate 14 between the drain zone 15 and the source zone 16.

The IGFET 3 of the depletion type comprises a source zone 19 and a drain zone 20 of first conductivity type which are embedded into the substrate 14. A gate zone 21 which has the same conductivity type as the zones 19 and 20 but is more weakly doped than these is embedded between these zones. The corresponding gate electrode 23 is formed by a doped polycrystalline silicon layer which overlaps both zones and is seated on an insulating layer 22. The threshold voltage of the IGFETs 3 and 4 is defined by the thickness of the oxide layers 17, 22 and/or by the resistivity of the gate zone 21 or the resistivity of the substrate.

The Zener diode 6 is formed by a p-doped zone 28, the zone 31 of the photodiode, an insulating layer 29 thick in comparison to the layers 17, 22, and by an electrode 30. The insulating layer 29 and the electrode 30 overlap the zone 31 and cover the zone 28. It is sufficient, however, when the zone 28 is likewise only overlapped by the insulating layer 29 and the electrode 30. The zone 28 and electrode 30 are electrically connected to one another; for example, they lie at cathode potential.

In combination with the insulating layer 29 and electrode 30, the zones 28, 31 form an IGFET having a higher threshold voltage. When the voltage at the gate 18 and thus the potential of the zone 31 increase with increasing alternating voltage, then the IGFET formed of zones 28 and 31 switches on as a result of channel formation at the surface of the semiconductor body 13 between these zones. The potential at gate 18 is limited to a value which is essentially defined by an ohmic voltage drop between the zones 28 and 31. This value is defined by a spacing between the zones, the doping between the zones, and by a width of the zones 28 and 31.

In combination with the electrode 30 and a further electrode 27 placed between the electrode 30 and the phototransistor, the zone 28 also fulfills the purpose of deforming the space charge zone emanating from the phototransistor such that as many of the charge carriers generated by the light as possible flow to the base zone 24 of the phototransistor.

The substrate 14 preferably is at ground so that capacitively generated currents can be carried off. The emitter 25 of the phototransistor 1 is connected to the gate terminal of the auxiliary thyristor 8. The connecting terminal is referenced 33 in FIGS. 1 and 2. The anode voltage $+U_A$ is supplied to the integrated circuit via an electrode lying on the underside of the semiconductor body 13. The thyristors 8 and 9 shown in FIG. 1 can likewise be accommodated in integrated form on the same semiconductor body 13. They can, however, also be discrete components.

The integrated arrangement can, for example, have the following dimensions:

| | |
|---|---|
| Resistivity of the semiconductor body | between 30 and 50 Ohm cm. |
| Doping of the highly n-doped zones | $10^{20}$ cm$^{-3}$. |
| Thickness of the highly doped zones | 0.5 throught 2 μm. |
| Doping of the p-doped zones | between $10^{17}$ and $10^{18}$ cm$^{-3}$. |
| Depth of the p-doped zones | between 1 and 4 /μm. |
| Spacing of the zones 28 and 31 | 20 μm. |
| Thickness of the insulating layer 29 | 1.5 μm. |
| Zone 21 can be doped with arsenic having a dosage of | 1 × $10^{12}$ cm$^{-2}$. |
| Spacing of the zones 19 and 20 | between 5 and 200 μm. |
| Thickness of the insulating layer 22 of the IGFET | 70 nm. |
| Doping of weakly p-doped parts | $10^{16}$ atoms cm$^{-3}$. |

Although various minor changes and modifications might be proposed by those skilled in the art, it will be understood that we wish to include within the claims of the patent warranted hereon all such changes and modifications as reasonably come within our contribution to the art.

We claim as our invention:

1. A circuit arrangement for drive of at least one thyristor connected to an alternating voltage, comprising:
   (a) a phototransistor, thyristor, and auxiliary transistor circuit means for enabling an ignition of the thyristor only in a proximity of a zero point of the alternating voltage;
   (b) a collector-emitter path of the phototransistor being connected between a first of two alternating voltage terminals and a gate terminal of the thyristor; and
   (c) said auxiliary transistor circuit means being formed of
      (i) an enhancement type IGFET whose source-drain path is connected between a base terminal of the phototransistor and a second alternating voltage terminal;
      (ii) a photodiode between a gate terminal of the IGFET and the first alternating voltage terminal;
      (iii) the photodiode being poled such that it is biased in a reverse direction when voltage is present at the thyristor in a conducting direction; and
      (iv) the IGFET having a higher threshold voltage and a lower input capacitance than the phototransistor.

2. A circuit arrangement according to claim 1 wherein a Zener diode is connected between the gate terminal and a source terminal of the IGFET.

3. A circuit arrangement according to claim 1 wherein the photodiode is formed of a zone of first conductivity type planarly embedded in a semiconductor body of second conductivity type; and a second zone of the photodiode being the semiconductor body.

4. A circuit arrangement according to claim 3 wherein the Zener diode has a zone of first conductivity type planarly embedded into the semiconductor body; the photodiode zone and the Zener diode zone being positioned adjacent one another and at a distance from one another; an electrode positioned over both zones, said electrode at least overlapping both zones; the electrode being insulated from the photodiode zone; and the electrode and the Zener diode zone being electrically connected to one another and connected to a fixed potential.

5. A circuit arrangement according to claim 1 wherein a capacitor is connected between the base terminal of the phototransistor and the second alternating voltage terminal.

6. A circuit arrangement according to claim 1 wherein the thyristor comprises an ignition-current-amplifying auxiliary thyristor; and the gate terminal of the auxiliary thyristor is connected to an emitter terminal of the phototransistor.

7. A circuit arrangement according to claim 1 wherein the first alternating voltage terminal is connected via a diode to the anode terminal of the thyristor and the second alternating voltage terminal is connected to the cathode terminal of the thyristor.

8. A circuit arrangement for enabling an ignition of a thyristor circuit in a proximity of a zero point of an alternating voltage connected to the thyristor circuit, comprising:
   a thyristor circuit connected to first and second terminals to which an alternating voltage is supplied;
   a phototransistor having its collector connected to an anode of a thyristor in the thyristor circuit and its emitter connected to drive a gate of the thyristor;
   an enhancement type IGFET having its source-drain path connected between a base of the phototransistor and the second terminal; and
   a diode having its anode connected to a gate of the IGFET and its cathode connected to the collector of the phototransistor.

* * * * *